(12) United States Patent
Friedrich

(10) Patent No.: US 7,633,111 B2
(45) Date of Patent: Dec. 15, 2009

(54) SEMICONDUCTOR STRUCTURE

(75) Inventor: Ulrich Friedrich, Ellhofen (DE)

(73) Assignee: Atmel Automotive GmbH, Heilbronn (DE)

( * ) Notice: Subject to any disclaimer, the term of this patent is extended or adjusted under 35 U.S.C. 154(b) by 463 days.

(21) Appl. No.: 11/197,358

(22) Filed: Aug. 5, 2005

(65) Prior Publication Data

US 2006/0028318 A1 Feb. 9, 2006

(30) Foreign Application Priority Data

Aug. 7, 2004 (DE) .................. 10 2004 038 528

(51) Int. Cl.
*H01L 29/94* (2006.01)

(52) U.S. Cl. ..................... 257/307; 257/304

(58) Field of Classification Search ............. 257/297
See application file for complete search history.

(56) References Cited

U.S. PATENT DOCUMENTS

| | | | |
|---|---|---|---|
| 4,200,892 A * | 4/1980 | Weimer ................. 348/310 |
| 4,355,374 A | 10/1982 | Sakai et al. | |
| 4,460,911 A | 7/1984 | Salters | |
| 5,220,483 A | 6/1993 | Scott | |
| 5,510,632 A * | 4/1996 | Brown et al. .............. 257/77 |
| 5,818,112 A | 10/1998 | Weber et al. | |
| 6,201,234 B1 * | 3/2001 | Chow et al. ........ 250/214 LS |
| 6,700,796 B2 * | 3/2004 | Detcheverry et al. ..... 361/792 |
| 6,728,113 B1 | 4/2004 | Knight et al. | |
| 7,098,394 B2 * | 8/2006 | Armer et al. ............ 136/244 |
| 2001/0039075 A1 | 11/2001 | Doyle et al. | |
| 2002/0163976 A1 | 11/2002 | Karthaus | |
| 2002/0171602 A1 * | 11/2002 | Feibig et al. ............ 343/907 |
| 2004/0145452 A1 * | 7/2004 | Fischer et al. ........... 340/10.1 |
| 2004/0206999 A1 * | 10/2004 | Hyde et al. ............. 257/312 |
| 2004/0245344 A1 | 12/2004 | Fischer et al. | |

FOREIGN PATENT DOCUMENTS

| | | | |
|---|---|---|---|
| DE | 27 05 503 A | | 8/1977 |
| DE | 30 29 125 A1 | | 2/1981 |
| DE | 43 00 519 A1 | | 7/1993 |
| DE | 101 21 855 A1 | | 2/2003 |
| DE | 103 22 888 A1 | | 12/2004 |
| JP | 5-13418 | * | 1/1993 |

(Continued)

OTHER PUBLICATIONS

Karl Goser :"From Transistors to Basic Circuits", Huethig Buch Verlag GmbH, 1990, pp. 45-47.

* cited by examiner

*Primary Examiner*—Wai-Sing Louie
*Assistant Examiner*—Bilkis Jahan
(74) *Attorney, Agent, or Firm*—Muncy, Geissler, Olds & Lowe, PLLC

(57) ABSTRACT

A semiconductor structure, for improving rectifier efficiency in passive backscatter transponders or backscatter remote sensors for use in high-frequency electromagnetic fields, is provided. The semiconductor structure has a dielectric layer on whose upper side is arranged a first electrically conductive layer, and a second electrically conductive layer that is spaced apart from the first electrically conductive layer and is arranged essentially below the first electrically conductive layer and is at least partially embedded in the dielectric layer. The dielectric layer has its lower side arranged on a semiconductor substrate of a first conductivity type within which is formed a more highly doped first zone of the first conductivity type which surrounds an even more highly doped second zone of the first conductivity type connected to a reference voltage. Whereby, the first zone can be arranged essentially completely under the first and second electrically conductive layers. In this way, interfering effects of parasitic circuit components can be reduced.

20 Claims, 2 Drawing Sheets

SEMICONDUCTOR STRUCTURE

This nonprovisional application claims priority under 35 U.S.C. §119(a) on German Patent Application No. DE 102004038528, which was filed in Germany on Aug. 7, 2004, and which is herein incorporated by reference.

BACKGROUND OF THE INVENTION

1. Field of the Invention

The present invention relates to a semiconductor structure, and further relates to applications of such a semiconductor structure.

2. Description of the Background Art

In RFID or remote sensor systems, use is frequently made today of passive backscatter transponders and remote sensors, which have no internal energy source, for example in the form of a battery, but instead extract the energy needed to power their integrated circuits (IC) from a high-frequency (HF) electromagnetic field radiated from a base station of the system. For this purpose, such transponders or remote sensors contain rectifier circuits which take energy that is transported by an HF carrier wave, captured by a suitable receiving device (antenna), and made available at what is called a (connecting) pad of the transponder or sensor IC, and convert the carrier wave into a DC supply voltage more suitable for operating the IC. Care must be taken in this process to ensure that the effects of parasitic circuit components such as resistors or capacitors—for short: parasitics—remain as small as possible, especially in the region of an input circuit, i.e. the pad of the transponder or sensor, since such components can otherwise have serious negative effects on the aforementioned systems on account of the dominant frequencies in the MHz or GHz range. Similar considerations also apply to the circuits for detecting the strength of a received signal (RSSI circuits) for use in the aforementioned systems.

A variety of different approaches exist for reducing the effects of parasitic circuit components. On the one hand, efforts are made to provide unavoidable parasitics with high quality factors to make it easier to compensate for them later. However, there also exists the possibility of providing parasitics with the lowest possible quality factor, so they no longer have an effect. This approach can only be poorly implemented, however, especially in ICs with small dimensions, since implementing large resistors with low quality factors results in a corresponding need for space that is not available in many IC architectures and is thus cost-intensive. Moreover, an obvious method is to attempt to permit only the smallest possible parasitics in the corresponding circuit components from the beginning through suitable designs.

It is known in this context that an input impedance with the smallest possible series resistance in the equivalent schematic is advantageous, since this results in a high quality factor for the input circuit. In addition, circular pad structures are generally used to keep the parasitic input capacitance at a low level. It is also known that the quality factor of a zone of semiconductor material located under the pad can be improved by a low dopant level.

In the German patent application 101 21 855.9, which corresponds to U.S. Publication No. 2002163976, which is incorporated herein by reference, relating to a Method for Matching an Antenna Tuned Circuit of a Passive Transponder, an approach is disclosed in relation to a semiconductor structure of the generic type according to which the quality factor of an input pad and thereby of a subsequent rectifier circuit can be improved by a lateral arrangement—relative to the electrically conductive layers—having a first zone of a first conductivity type and at least one highly doped second zone of a second conductivity type that is enclosed by the first zone.

Furthermore, there are known from the unpublished German patent application 103 22 888, which corresponds to U.S. Publication No. 2004245344, which is incorporated herein by reference, relating to an Integrated Circuit with Transponder, approaches to solutions for various rectifier circuits, by means of which parasitic effects can likewise be minimized through skillful selection and arrangement of Schottky diodes.

SUMMARY OF THE INVENTION

It is therefore an object of the present invention to provide a semiconductor structure, in particular for HF applications, which possesses further improved characteristics with respect to the effects of parasitic circuit components and which is also compatible in terms of its circuit layout with novel assembly methods for transponder or sensor ICs, especially methods using flip-chip technology.

The object is attained in a semiconductor structure of the aforementioned type in that a first zone is arranged essentially completely underneath the first and second electrically conductive layers, e.g. of aluminum. In this novel arrangement, the pad accordingly includes a capacitor that is formed by the two electrically conductive layers. Thus, in accordance with the invention it is possible, viewed from the opposite perspective, for the first coupling capacitor of a rectifier or RSSI circuit that is known per se to be designed as a pad. In other words, the first capacitor of one/each stage of an RSSI or power supply rectifier is formed by two layers of a pad.

In this context, provision is made in a further embodiment of the invention that a capacitor formed by the first and second electrically conductive layers is connected by the first electrically conductive layer to a subsequent stage of a multistage rectifier circuit and is connected by the second electrically conductive layer to the first stage of the multistage rectifier circuit.

In the course of a particularly preferred further development of the invention, the semiconductor structure created is characterized in that the first electrically conductive layer is formed by a receiving device of the semiconductor structure for electromagnetic waves, in particular an antenna of the transponder or remote sensor. In other words, the first capacitor of one/each stage of an RSSI or power supply rectifier is formed by the antenna and a first layer of the IC. Such an arrangement is extremely compact and economical to implement; moreover, the parasitic capacitance of the coupling capacitors is further reduced in this way.

For the purpose of an especially simple embodiment of the inventive semiconductor structure, the first and second electrically conductive layers can be essentially flat and arranged parallel to one another.

For HF applications, the above-mentioned rectifier or RSSI circuits can use Schottky diodes, which in themselves have only a very small parasitic capacitance value as a result of negligible charge storage in the forward-biased state. To this end, a further embodiment of the inventive semiconductor structure has at least one first layer with metallic properties, which is arranged in a junction region between the dielectric layer and the first zone below the second electrically conductive layer and is electrically connected to the latter. It is thus possible within the scope of the invention to place the Schottky diodes directly under the pad and the first coupling capacitor, which in turn makes it possible to reduce the parasitic connections and the parasitic area of the "pad capacitor."

Alternatively, in a further embodiment of the semiconductor structure, provision can also be made for the second electrically conductive layer itself to have metallic properties and to extend, at least in sections, into a junction region between the dielectric layer and the first zone below the second electrically conductive layer. In this way the additional layer with metallic properties can be omitted, which means an economical simplification of the subject of the invention.

It is further possible to place the entire first stage, for example of a multistage rectifier circuit, under the pad of an inventive semiconductor structure so as to achieve an even further reduction of parasitic influences. For this purpose, provision is made for producing in the semiconductor substrate a more highly doped third zone of a second conductivity type which surrounds an even more highly doped fourth zone of the second conductivity type which is connected to a reference voltage, where the third zone is arranged essentially completely under the first and second electrically conductive layers.

In this context, a further embodiment of the semiconductor structure provides, for the purpose of an advantageous embodiment of a Schottky diode, that at least one second layer with metallic properties is formed that is arranged in a junction region between the dielectric layer and the third zone below the second electrically conductive layer and is electrically connected to the latter. Alternatively, for purposes of simplification, provision can in turn be made here for the second electrically conductive layer itself to have metallic properties and to extend, at least in sections, into a junction region between the dielectric layer and the third zone below the second electrically conductive layer.

Moreover, for compatibility with modern IC assembly processes, provision can be made to provide on the first electrically conductive layer a deposit of electrically conductive material, known as a bump, which projects above the upper side of the dielectric layer.

As mentioned several times above, such an inventive semiconductor structure is primarily suited for use in, for example, a power supply circuit for an integrated circuit, particularly in backscatter transponders or remote sensors, or in a circuit for detecting the strength of a received signal (RSSI circuit) particularly in backscatter transponders or remote sensors.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
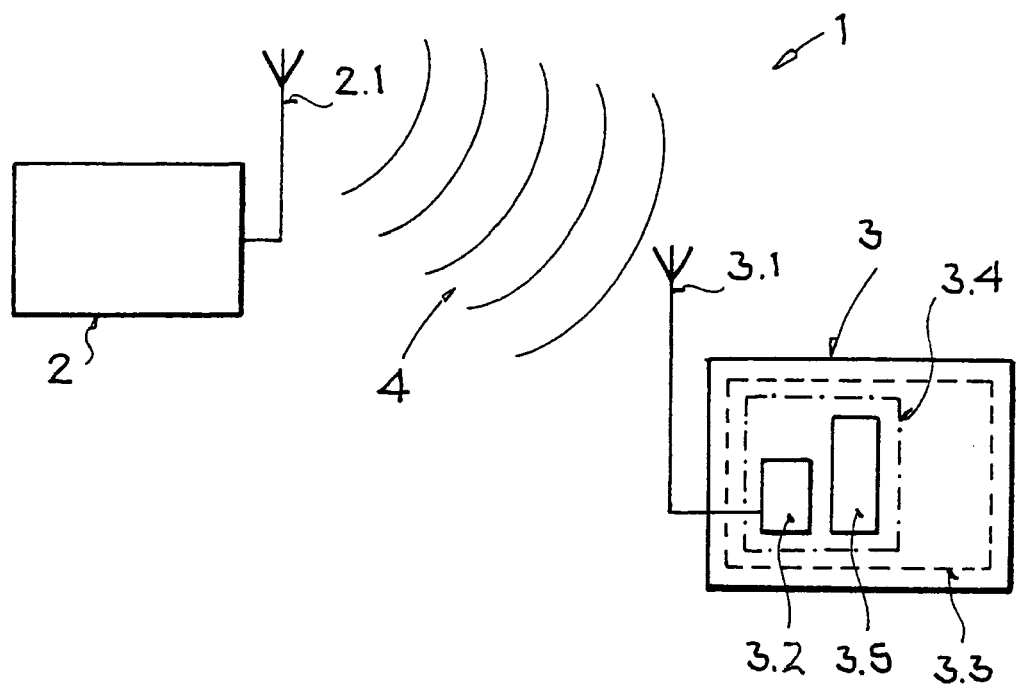
FIG. 1 is a schematic representation of an RFID system with a base station and a passive transponder.

FIG. 1 shows a simplified, schematic representation of an RFID system 1 with a base station 2 and a passive transponder or remote sensor 3 that is supplied with electrical energy by an HF electromagnetic field 4 generated by the base station 2 and transmitted by a transmitting device 2.1 of the base station 2.

The transponder 3 has an appropriate receiving device 3.1, for example in the form of a dipole antenna, to receive electrical energy from the HF field 4, the receiving device standing in operative connection with an input pad 3.2 of an integrated circuit 3.3. The input pad 3.2 is part of an inventive semiconductor structure 3.4 which is described in detail below with the aid of FIGS. 2 through 4. In addition, the transponder IC 3.3 from FIG. 1 has a circuit 3.5 within the semiconductor structure 3.4 which can be an RSSI circuit or a rectifier circuit. The former is used to analyze (notch detection) an amplitude-modulated signal (AM signal), and the latter is used to produce a DC supply voltage for the transponder 3 or its integrated circuit 3.3 from the energy received from the HF field 4.

Figure 2:
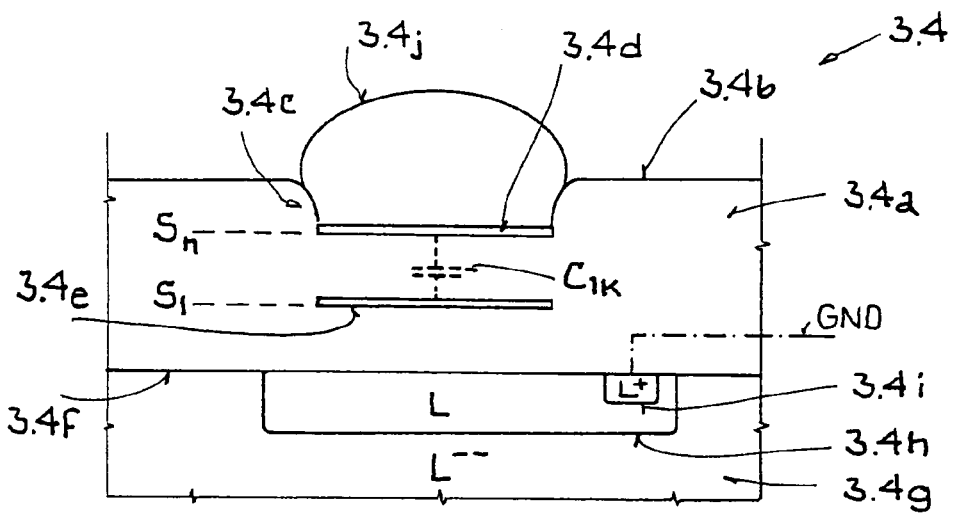
FIG. 2 is a section through a first embodiment of a semiconductor structure according to the invention.

FIG. 2 shows a section through an inventive semiconductor structure 3.4 (see FIG. 1). It has a dielectric layer 3.4a, on whose upper side 3.4b is arranged a first electrically conductive layer 3.4d in the area of a depression 3.4c. Spaced apart from the first electrically conductive layer 3.4d there is provided a second electrically conductive layer 3.4e, which is arranged essentially below the first electrically conductive layer 3.4d and is at least partially embedded in the dielectric layer 3.4a. In the example embodiment shown, the layers 3.4d, 3.4e are designed to be flat and oriented parallel to one another. The dielectric layer 3.4a here is arranged with its lower side 3.4f on a semiconductor substrate 3.4g of a first conductivity type L, which can be either a p-conductive or n-conductive semiconductor material.

Formed within the semiconductor substrate 3.4g with doping $L^-$ is a more highly doped (L) first zone 3.4h of the first conductivity type L, which surrounds an even more highly doped ($L^+$) second zone 3.4i of the first conductivity type L connected to a reference voltage GND. The first zone 3.4h is arranged essentially completely under the first and second electrically conductive layers 3.4d, 3.4e.

The connection between the second zone 3.4i and the reference voltage GND is shown only schematically. In practice, it can be implemented, for example, by a metal-filled trench that contacts the zone 3.4i from the upper side 3.4b of the dielectric layer 3.4a.

As is indicated by the dashed horizontal lines in FIG. 2, the electrically conductive layers 3.4d, 3.4e in the example embodiment shown are connected to an n-th stage $S_n$ or the first stage $S_1$ of a multistage rectifier circuit 3.5 that is known per se and is shown again below using FIG. 5 in order to simplify the description.

Provided on and above the first electrically conductive layer 3.4d is a deposit 3.4j of electrically conductive material, known as a bump, projecting above the upper side 3.4b of the dielectric layer 3.4a, the bump being used for assembling and contacting the inventive semiconductor structure, for example as part of a flip-chip arrangement; here, it serves in particular to connect the first conductive layer 3.4d after the fashion of an input pad 3.2 (see also FIG. 1) to the receiving device 3.1 of the transponder 3.

The electrically conductive layers 3.4d, 3.4e form, together with the dielectric 3.4a of the first coupling capacitor $C_{1K}$ (shown in dashed lines) of the rectifier circuit 3.5 (FIG. 1), which can thus be designated as a "pad capacitor." As a result of the first zone 3.4*h* arranged under this capacitor $C_{1K}$, which in accordance with FIG. 2 is designed as a p-well or n-well based on the chosen semiconductor substrate 3.4*g* and is connected to the reference voltage GND (ground), an improvement is achieved in the quality factor of the parasitic capacitor between the lower, second electrically conductive layer 3.4*e* and the well, resulting in improved rectifier efficiency of the (backscatter) transponder 3 in accordance with the object as stated above.

In a second embodiment, shown in FIG. 3, of the inventive semiconductor structure 3.4 (FIG. 1), in contrast to the representation of FIG. 2, a layer 3.4*l* with metallic properties is arranged below the second electrically conductive layer 3.4*e* in a junction zone 3.4*k* between the dielectric layer 3.4*a* and the first zone 3.4*h* and is connected in an electrically conductive manner to the second electrically conductive layer 3.4*e*, as symbolized in FIG. 3 by a vertical line 3.4*m*. In this way a Schottky diode with the aforementioned advantageous properties is formed in the region of the metal-semiconductor junction 3.4*k*.

In this way it is possible according to the invention for the Schottky diodes that are generally used in the rectifier circuit 3.5 (FIG. 5), which are advantageously embodied in L-wells (first zone 3.4*h*) in an L-substrate (semiconductor substrate 3.4*h*), to be placed directly under the pad (conductive layers 3.4*d*, 3.4*e*) or the first coupling capacitor $C_{1K}$, thus reducing parasitic connections as well as the parasitic capacitor area.

Figure 3:
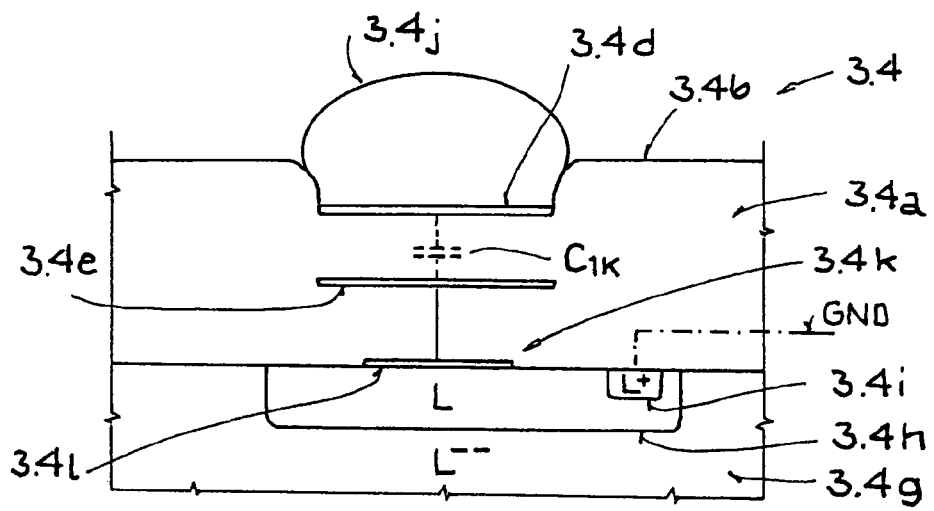
FIG. 3 is a section through a second embodiment of a semiconductor structure according to the invention.
Figure 4:
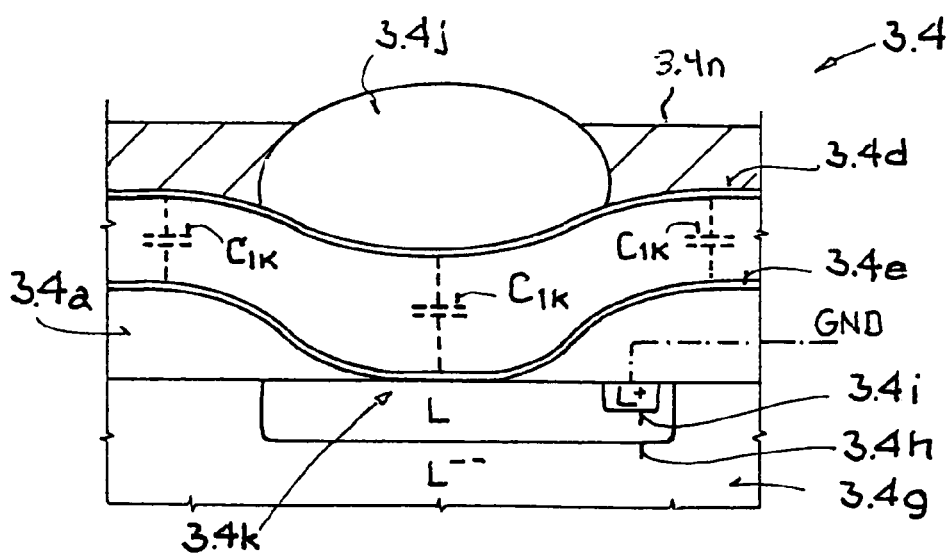
FIG. 4 is a section through a third embodiment of the semiconductor structure according to the invention.

FIG. 4 shows another possible embodiment of the inventive semiconductor structure 3.4 where, in a variation of the embodiment shown in FIG. 3, the second electrically conductive layer 3.4*e* itself has metallic properties and has a trough-shaped form in cross-section such that, in region 3.4*k* (FIG. 3), it contacts the first zone 3.4*h* and forms a Schottky diode junction. Thus, in the subject of FIG. 4, the additional layer 3.4*l* (FIG. 3) is eliminated, resulting in a structural and economical simplification. In the embodiment shown, an additional passivation layer 3.4*n* is arranged above the first conductive layer 3.4*d* to protect the first conductive layer 3.4*d*.

Figure 5:
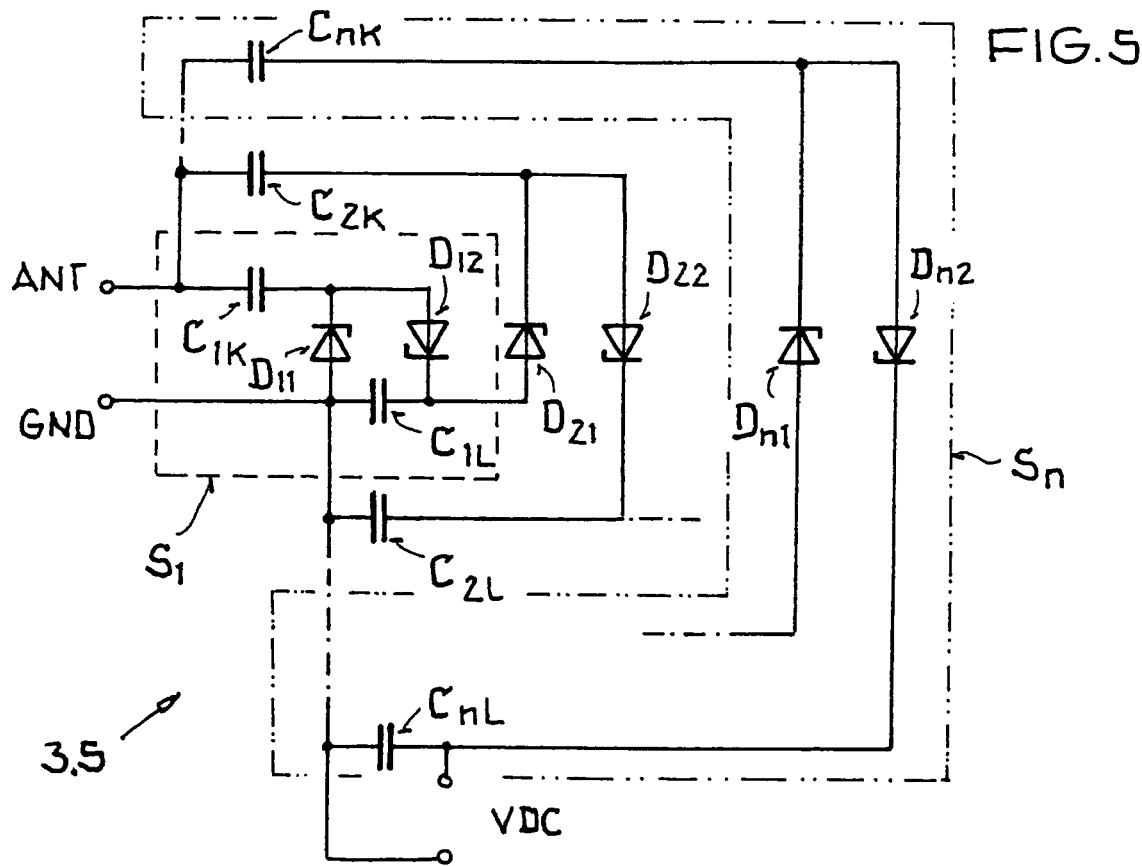
FIG. 5 is a schematic of a multistage rectifier.

Lastly, FIG. 5 shows a schematic of an n-stage rectifier 5, which is discussed in DE 10 2004 040 182.9-23 and DE 10 2005 035 346.0, which were filed on Aug. 19, 2004 and Jul. 28, 2005, respectively, and which are both herein incorporated by reference. Each stage $S_i$ (i=1, ..., n) of the rectifier 3.5 (see also FIG. 2), of which two $S_1$, $S_n$ are enclosed by dashed lines in FIG. 5, is accordingly equipped with a coupling capacitor $C_{iK}$ (see also FIGS. 2-4) and a load capacitor $C_{iL}$ and two Schottky diodes $D_{i1}$ and $D_{i2}$. The two connections ANT, GND of the rectifier 3.5 are connected to the receiving device 3.1 (FIG. 1) of the transponder 3 and the reference voltage, respectively. The load side of the rectifier 3.5 delivers the DC supply voltage VDC for the transponder IC 3.3 (FIG. 1).

Furthermore, in a further development of the semiconductor structures 3.4 as shown in FIGS. 3 and 4, provision can be made, particularly in an at least partial implementation of the rectifier circuit 3.5 shown in FIG. 5, to form in the semiconductor substrate 3.4*g* a more highly doped third zone (not shown) of a second conductivity type, analogous to the first zone 3.4*h*, which third zone surrounds a still more highly doped fourth zone of the second conductivity type that is connected to the reference voltage GND, where the third zone is arranged essentially completely underneath the first and second electrically conductive layers 3.4*d*, 3.4*e*. In this context, the first and second conductivity types can be the same conductivity type or different conductivity types.

In this way, by providing at least one second layer (not shown) with metallic properties, which corresponds to the first layer 3.4*l* functionally and in terms of its design and which is arranged in a junction region between the dielectric layer 3.4*a* and the third zone below the second electrically conductive layer and is electrically connected to the latter, it is possible to form a second Schottky diode that is usable in the design implementation of a rectifier stage (see also FIG. 5). Thus, in accordance with the invention, the complete first rectifier stage $S_1$ in particular can advantageously be placed directly under the input pad 3.2 (FIG. 1) in order to minimize parasitic influences.

As an alternative to the embodiment described above, it is also possible, in a manner analogous to the subject of FIG. 4, for the second electrically conductive layer to itself have metallic properties and to extend, at least in sections, into the junction region between the dielectric layer 3.4*a* and the third zone below the second electrically conductive layer.

Alternative rectifier circuit arrangements which can be advantageously implemented according to the invention in this way are disclosed in the aforementioned patent application DE 103 22 888.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A semiconductor structure comprising:
a dielectric layer;
a first electrically conductive layer being provided on an upper side of the dielectric layer; and
a second electrically conductive layer that is spaced apart from the first electrically conductive layer and is arranged below the first electrically conductive layer and is at least partially embedded in the dielectric layer,
wherein the dielectric layer has a portion of a lower side thereof provided on a semiconductor substrate that has a first conductivity type,
wherein there is formed within the semiconductor substrate a highly doped first zone of the first conductivity type, the first zone partially encompassing a greater doped second zone having the first conductivity type, the second zone being connected to a reference voltage, and
wherein the entirety of the first zone is arranged under the first and second electrically conductive layers.

2. The semiconductor structure according to claim 1, wherein a capacitor, which is formed by the first and second electrically conductive layers, is connected by the first electrically conductive layer to a subsequent stage of a multistage rectifier circuit and is connected by the second electrically conductive layer to a first stage of the multistage rectifier circuit.

3. The semiconductor structure according to claim 1, wherein the first electrically conductive layer is formed by a receiving device of the semiconductor structure for receiving electromagnetic waves.

4. The semiconductor structure according to claim , wherein the first and second electrically conductive layers have a substantially horizontal plane and are parallel to one another.

5. The semiconductor structure according to claim 1, further comprising at least one first layer having metallic properties is arranged in a junction region between the dielectric layer and the first zone and below the second electrically conductive layer, the at least one first layer being electrically connected to the second electrically conductive layer.

6. The semiconductor structure according to claim 1, wherein the second electrically conductive layer has metallic properties and extends, at least in sections, into a junction region that is formed between the dielectric layer and the first zone that is below the second electrically conductive layer.

7. The semiconductor structure according to claim 1, wherein there is formed in the semiconductor substrate a more highly doped third zone having a second conductivity type, the third zone partially surrounding an even more highly doped fourth zone having the second conductivity type, the fourth being connected to a reference voltage, and wherein the third zone is arranged under the first and second electrically conductive layers.

8. The semiconductor structure according to claim 7, wherein at least one second layer having metallic properties is arranged in a junction region between the dielectric layer and the third zone that is below the second electrically conductive layer, the at least one second layer being electrically connected to the second electrically conductive layer.

9. The semiconductor structure according to claim 7, wherein the second electrically conductive layer has metallic properties and extends, at least in sections, into a junction region formed between the dielectric layer and the third zone that is below the second electrically conductive layer.

10. The semiconductor structure according to one claim 1, wherein, on the first electrically conductive layer, a deposit is formed of an electrically conductive material which projects above the upper side of the dielectric layer.

11. The semiconductor substrate according to claim 1, wherein the semiconductor substrate is provided in a power supply circuit for an integrated circuit, a backscatter transponder, or a remote sensor.

12. The semiconductor substrate according to claim 1, wherein the semiconductor substrate is provided in a circuit for detecting a strength of a received signal in a backscatter transponder or a remote sensor.

13. The semiconductor structure according to claim 1, wherein the semiconductor structure increases rectifier efficiency in passive backscatter transponders or backscatter remote sensors that are used in high-frequency electromagnetic fields.

14. The semiconductor structure according to claim 2, wherein the receiving device is an antenna of a transponder or remote sensor.

15. A transponder comprising:
a semiconductor substrate having a first conductivity type;
a dielectric layer, the dielectric layer having a lower surface adjacent to a portion of an upper surface of the semiconductor substrate;
a first electrically conductive layer being provided on an upper surface of the dielectric layer;
a second electrically conductive layer being provided in a portion of the dielectric layer such that the second electrically conductive layer is between the first electrically conductive layer and the semiconductor substrate, the second electrically conductive layer having first and second opposite edges;
a doped first zone of the first conductivity type being partially formed within the semiconductor substrate and projecting under said first and second opposite edges of the second electrically conductive layer; and
a doped second zone of the first conductivity type, the doped second zone being partially encompassed by the doped first zone, the doped second zone having a higher doping than the doped first zone.

16. The transponder according to claim 15, wherein the transponder is a passive transponder.

17. The transponder according to claim 15, wherein the second electrically conductive layer is provided between the doped first zone and the first electrically conductive layer.

18. The transponder according to claim 15, wherein a portion of an upper surface of the doped first zone contacts a portion of a lower surface of the second electrically conductive layer.

19. The transponder according to claim 15, wherein the first electrically conductive layer and the second electrically conductive layer are substantially parallel.

20. The transponder according to claim 15, wherein the first electrically conductive layer and the second electrically conductive layer are electrically connected to a rectifier circuit or a multi-stage rectifier circuit.

* * * * *